United States Patent
Imondi

(10) Patent No.: US 7,154,800 B2
(45) Date of Patent: Dec. 26, 2006

(54) NO-PRECHARGE FAMOS CELL AND LATCH CIRCUIT IN A MEMORY DEVICE

(75) Inventor: Giuliano Gennaro Imondi, Via Benucci (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/196,913

(22) Filed: Aug. 4, 2005

(65) Prior Publication Data

US 2005/0270879 A1    Dec. 8, 2005

Related U.S. Application Data

(63) Continuation of application No. 10/727,087, filed on Dec. 2, 2003, now Pat. No. 6,967,889.

(30) Foreign Application Priority Data

Jul. 7, 2003    (IT) .................. RM2003A0329

(51) Int. Cl.
*G11C 17/18* (2006.01)

(52) U.S. Cl. ..................... 365/225.7; 365/96
(58) Field of Classification Search ............. 365/225.7, 365/96, 200, 189.05
See application file for complete search history.

(56) References Cited

U.S. PATENT DOCUMENTS

| 5,852,580 | A | 12/1998 | Ha |
| 5,912,841 | A | 6/1999 | Kim |
| 5,933,370 | A * | 8/1999 | Holzmann et al. ..... 365/189.05 |
| 6,021,067 | A * | 2/2000 | Ha .................. 365/185.21 |
| 6,426,910 | B1 | 7/2002 | Santin |
| 6,590,825 | B1 * | 7/2003 | Tran et al. ............ 365/225.7 |
| 6,654,272 | B1 | 11/2003 | Santin |
| 6,845,029 | B1 | 1/2005 | Santin |
| 2002/0122331 | A1 | 9/2002 | Santin |
| 2004/0037131 | A1 | 2/2004 | Santin |

FOREIGN PATENT DOCUMENTS

WO    WO 02069347    9/2002

* cited by examiner

*Primary Examiner*—Anh Phung
(74) *Attorney, Agent, or Firm*—Leffert, Jay & Polglaze P. A.

(57) ABSTRACT

The fuse and latch circuit has a Floating gate Avalanche injection Metal Oxide Semiconductor (FAMOS) transistor (fuse) that is coupled to a read circuit. The read circuit includes circuitry that reduces the drive strength of the fuse. A transmission gate couples the read circuit to the latch circuit. The transmission gate isolates the fuse from the latch. When a reset condition occurs, the data that was in latch circuit remains after the reset condition is complete.

14 Claims, 6 Drawing Sheets

NO-PRECHARGE FAMOS CELL AND LATCH CIRCUIT IN A MEMORY DEVICE

RELATED APPLICATION

This application is a Continuation of U.S. application Ser. No. 10/727,087, filed Dec. 2, 2003, titled "NO-PRE-CHARGE FAMOS CELL AND LATCH CIRCUIT IN A MEMORY DEVICE", now U.S. Pat. No. 6,967,889 issued on Nov. 22, 2005, which is commonly assigned and incorporated herein by reference. U.S. patent application Ser. No. 10/727,087 claims priority to Italian Patent Application Serial No. RM2003A000329, filed Jul. 7, 2003, entitled "A NO PRE-CHARGE FAMOS CELL AND LATCH CIRCUIT IN A MEMORY DEVICE," which is commonly assigned.

TECHNICAL FIELD OF THE INVENTION

The present invention relates generally to memory devices and in particular the present invention relates to fuse cells and latches in memory devices.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices. Most electronic devices are designed with a single flash memory device.

Flash memory devices typically use Floating gate Avalanche injection Metal Oxide Semiconductor (FAMOS) cells, also referred to as fuses, to store device information. This information may include the address of defective memory array columns or rows and analog circuit configuration. The fuses are associated with latches in order to make the data stored in the fuse constantly available without the need for a typical flash memory read operation through the sense amplifiers.

FIG. 1 illustrates a schematic diagram of a typical prior art fuse and latch. In this scheme, the READ signal for the n-channel transistor 105 is normally in a logical low state. This turns off the transistor 105 and isolates the fuse 101. The signal FUSE_CLEAR is low to turn off the n-channel transistor 103, making it not effective. The signal PRE_CHARGE is high to turn off the p-channel transistor 113, making it not effective. The signal FSLTCH_BIAS is an analog signal that assumes a value between $V_{cc}$ and $V_{ss}$. That signal is normally low to turn on p-channel transistor 111, allowing the latch made by the inverter 107 and by the transistors 109 and 110, to be properly supplied by $V_{cc}$. To read the fuse 101, the signals PRE_CHARGE, FSLTCH_BIAS and READ are operated in sequence in two separate time intervals. In the first time interval, usually referred to as the precharge operation, while the READ and FSLTCH_BIAS signals are still low, the signal PRE_CHARGE goes low and therefore the p-channel transistor 113 is turned on to force the node OUTB at $V_{cc}$. Therefore the inverter 107, having at its input $V_{cc}$, turns low ($V_{ss}$) the node OUT and this, throughout the transistors 109 and 110, confirms (latches) the node OUTB ad $V_{cc}$. In the second time interval, usually referred to as the sensing operation, the signal PRE_CHARGE goes back high, so that the p-channel transistor 113 is turned off, while the signal READ goes high, so that the n-channel 105 transistor is turned on to connect the fuse 101 to the latch structure. In addition, during the second time interval the signal FSLTCH_BIAS goes to an intermediate value between $V_{ss}$ and $V_{cc}$, so that the p-channel transistor 111 is still turned on, while its capability to conduct current is strongly reduced. That way, the series of the two p-channel transistors 111 and 109 will not be able to contrast the current eventually driven by the fuse 101 and flowing throughout the n-channel transistor 105. If the fuse 101 is programmed, a low current will flow from $V_{cc}$ to $V_{ss}$ throughout the transistors 111, 109, 105 and the fuse 101 and a logical low signal is at the input of the inverter 107. Therefore, the latch transistors 109 and 110 receive a logical high output from the inverter 107 and confirm (latch) the logical low at node OUTB. If the fuse 101 is erased no current flows through it, the latch transistors 109 and 110 receive a logical low from the inverter 107 and confirm (latch) the logical high at node OUTB.

When the prior art circuit of FIG. 1 must be cleared (this usually happens during testing operations only, while still in the factory), the fuse_clear signal is brought to a logical high to turn on the n-channel transistor 103, while the signal PRE_CHARGE is maintained high to turn off transistor 113. This allows current to flow from Vcc through the p-channel transistors 111 and 109 and the n-channel transistor 103 to ground. This provides a logical high to the latch transistors 109 and 110, thus placing the latch into a default "erased" state before it receives its proper value from the fuse 101.

When a reset operation of the device occurs, both at power up and when the user applies to the device the proper reset pulse, this usually requires that, the latch must be reloaded with the proper ("erased" or "programmed") data from the fuse 101. This managed, as explained above, in two distinct time intervals, is commonly referred to as the precharge and the sensing operations. The precharge operation reduces the speed at which the memory can respond after a reset condition has been experienced. An additional problem is that if a reset pulse is stopped too early for some reason, the proper value may not be reloaded into the latch and this error condition may not be detectable before causing additional errors to occur from the corrupted latch data.

For the reasons stated above, and for other reasons stated below which will become apparent to those skilled in the art upon reading and understanding the present specification, there is a need in the art for a fuse and latch circuit that does not require a precharge operation.

SUMMARY

The above-mentioned problems with precharging a fuse and latch circuit and other problems are addressed by the present invention and will be understood by reading and studying the following specification.

The various embodiments relate to a fuse and latch circuit that can be read after an initialization or reset operation that occurs during the power up only, without precharging from the fuse. The circuit includes a fuse that has either a programmed state or an erased state. The fuse, in one embodiment, is a Floating gate Avalanche injection Metal Oxide Semiconductor (FAMOS) cell. A latch that stores either the programmed state or the erased state from the fuse is coupled to the fuse through a transfer circuit. A fuse read circuit is coupled to the fuse and a READ signal, in order to sense the state of the fuse.

The transmission circuit, in one embodiment, is a transfer gate. This circuit isolates the latch in response to the PRE_CHARGE signal such that the state stored in the latch remains after the read signal indicates completion of a read operation.

Further embodiments of the invention include methods and apparatus of varying scope.

DETAILED DESCRIPTION

Figure 1:
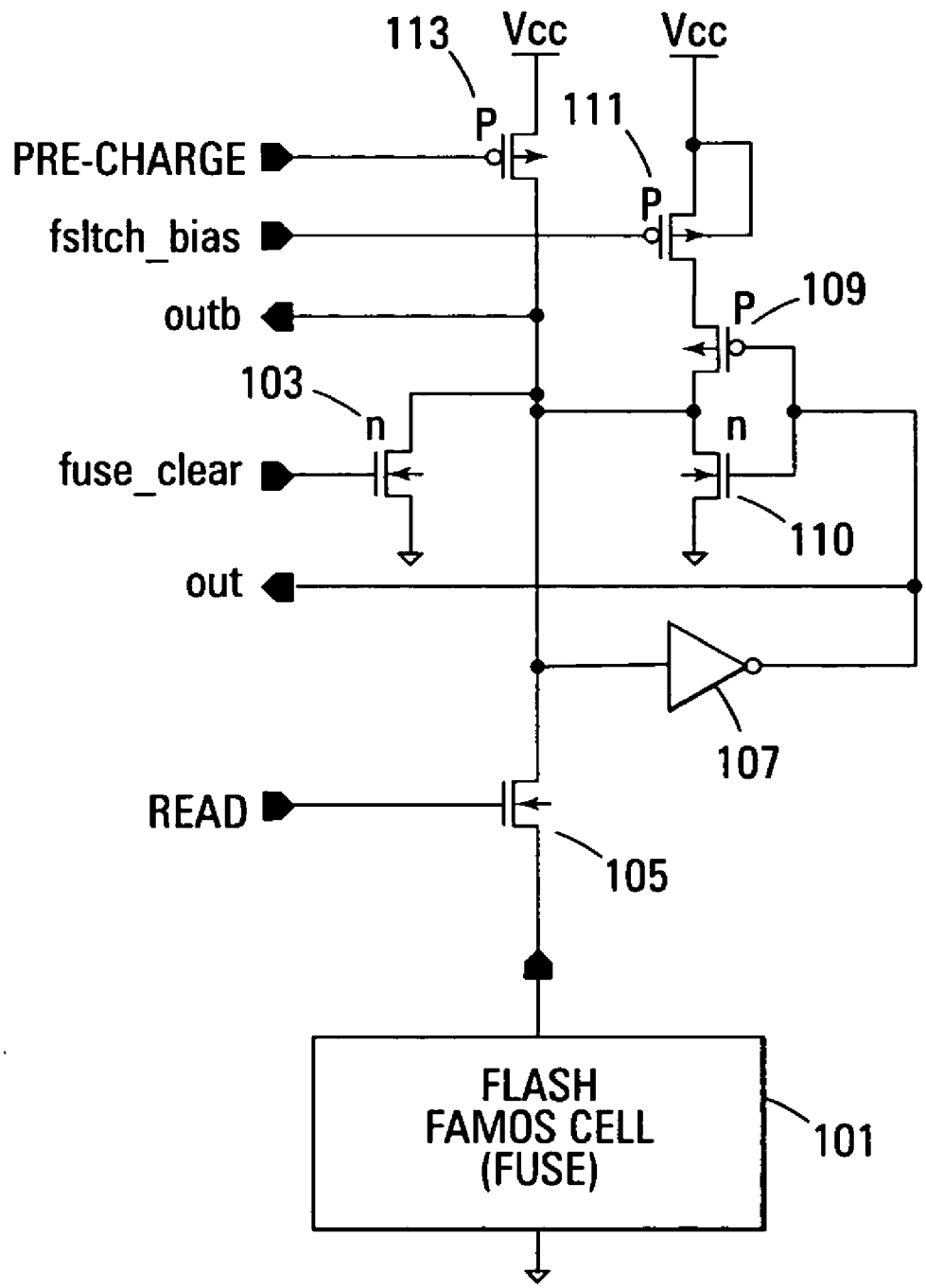
FIG. 1 shows a schematic diagram of a typical prior art precharge fuse.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
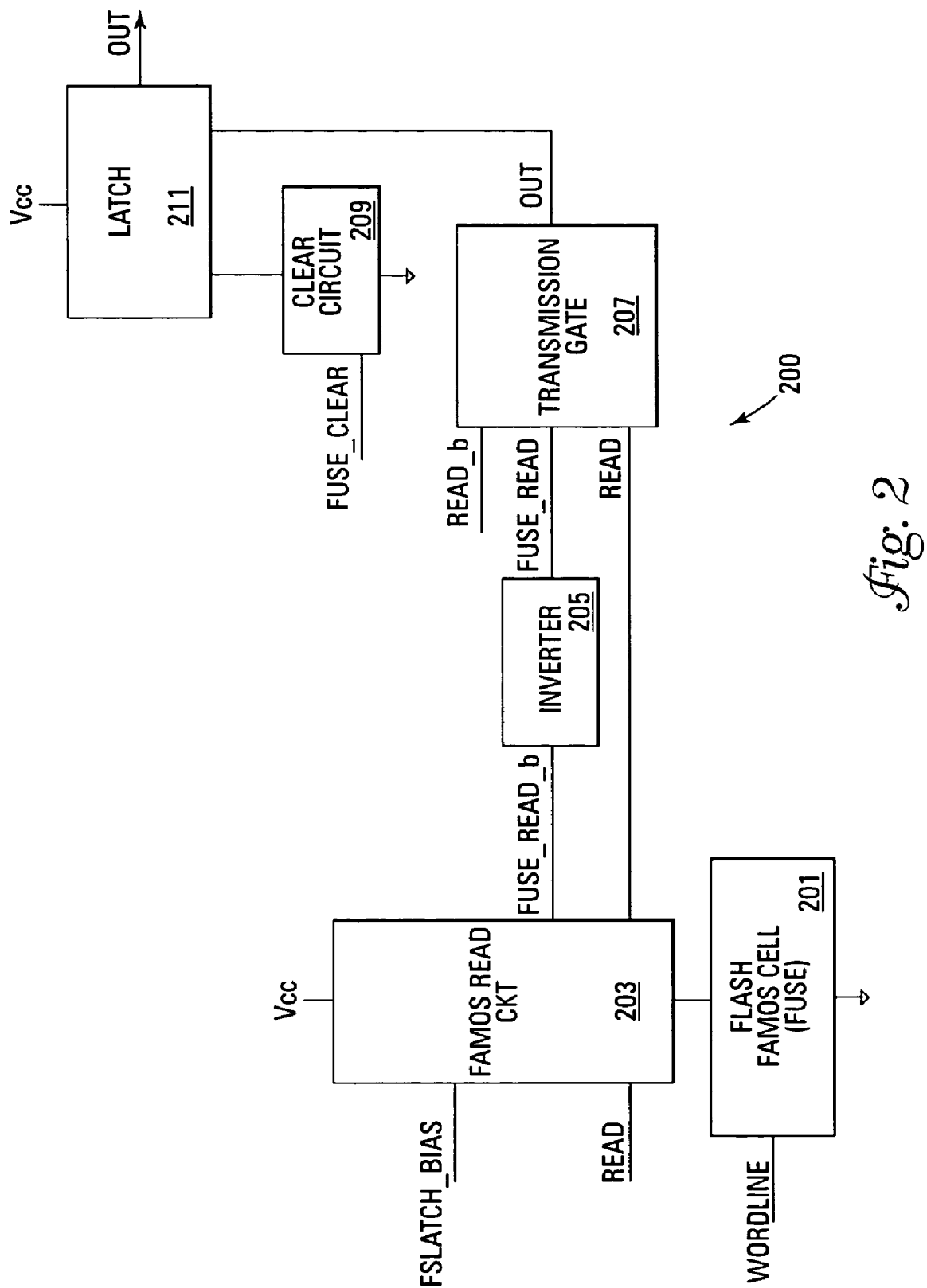
FIG. 2 shows a block diagram of one embodiment of the no-precharge FAMOS cell and latch circuit of the present invention.

FIG. 2 illustrates a block diagram of one embodiment of the no-precharge FAMOS cell and latch circuit of the present invention. The circuit has a flash FAMOS transistor cell 201 that is subsequently referred to as a fuse. The fuse 201 has two states: erased and programmed. In the erased state, the FAMOS transistor that makes up the fuse 201 is able to conduct current to ground. In the programmed state, the transistor cannot conduct current. A signal that for most applications reaches the voltage of about 4.5V, is placed on a WORDLINE in order to read the data from the fuse 201. The read operation of the fuse 201 is well known in the art and is not discussed further.

A FAMOS read circuit 203 is coupled to the fuse 201 to either isolate the fuse 201 or allow the fuse data to be read out, depending on the state of the input signals FSLATCH_BIAS and READ. One embodiment for generating these signals is described subsequently with reference to the driver circuit of FIG. 3.

The FSLATCH_BIAS signal, in one embodiment, is an analog signal normally at an intermediate value between $V_{cc}$ and ground such signal that it reduces the current of the read circuit 203 to allow the proper sensing of the fuse 201. The READ signal is a normally low signal that isolates the fuse 201 from the rest of the circuit. When READ is high, the read circuit 203 is enabled and the fuse state can be read.

A FUSE_CLEAR signal clears the latch 211 to a default state. In one embodiment, the default state is a logical high. When the FUSE_CLEAR signal goes to a logical high state, a clear circuit 209 sets the latch to the logical high state. This is the erased state of the fuse 201. An alternate embodiment uses a logical low state as the default state and/or a logical low state for the FUSE_CLEAR signal.

In operation, the circuit 200 is initialized by a power-on reset and the fuse latch is initially assumed to be cleared (i.e., in the state corresponding to an erased fuse). This is not mandatory for the proper functioning of the invention, that works correctly also with the latch initially in the opposite state. Anyway, the initial clearing of the latch can be obtained in several manners, e.g. by dividing the power up RESB signal into two parts and by using its first part to generate the FUSE_CLEAR signal. As discussed subsequently with reference to FIG. 3, the READ signal is high while FSLTCH_BIAS signal is at an intermediate value between $V_{cc}$ and ground and FSLATCH_BIAS signals during a power-on reset operation. If the fuse is erased (i.e. the FAMOS cell is conducting), This causes the FAMOS read circuit 203 to generate a logical low signal at FUSE_READ_b and, therefore, a logical high signal at the output of the inverter 205. The FUSE_CLEAR signal is supposed to be low during this operation.

The READ signal and its inverse, READ_b, enable a transmission gate 207 to allow the logical signal from the inverter 205 to be input to the latch 211. This signal is now the OUT signal as well. The transmission gate 207 or other type of transfer/isolation circuit isolates the latch from the rest of the circuit when it is not enabled. Alternate embodiments may use other types of transfer/isolation circuits than the transmission gate of the present invention. For example, a high impedance buffer circuit may perform a substantially similar function.

After the fuse is programmed (i.e., non-conducting) a read operation may be executed by bringing WORDLINE high. If READ is also a logical high, this causes the output of the FAMOS read circuit 203 to be a logical high (i.e., FUSE_READ_b=high). Therefore, the output of the inverter 205, FUSE_READ, is a logical low signal. Since READ and READ_b are active, the transmission gate 207 is turned on and the logical low signal is set in the latch 211 and is now the OUT signal.

Both in the cases the FAMOS cell is erased or programmed, the content of the FAMOS cell is directly transferred into the latch while the signal READ is high, i.e. during the reset operation (signals RESB or RP# low). Therefore, unlike the prior art fuse, the present invention provides the fuse 201 contents already in the latch 211 as soon as the reset operation has been completed. There is no need to precharge the fuse latch circuit 200, thus enabling a memory circuit incorporating the fuse latch circuit to respond faster to latch read operations. One implementation of this block diagram is illustrated subsequently with reference to FIG. 4.

Figure 3:
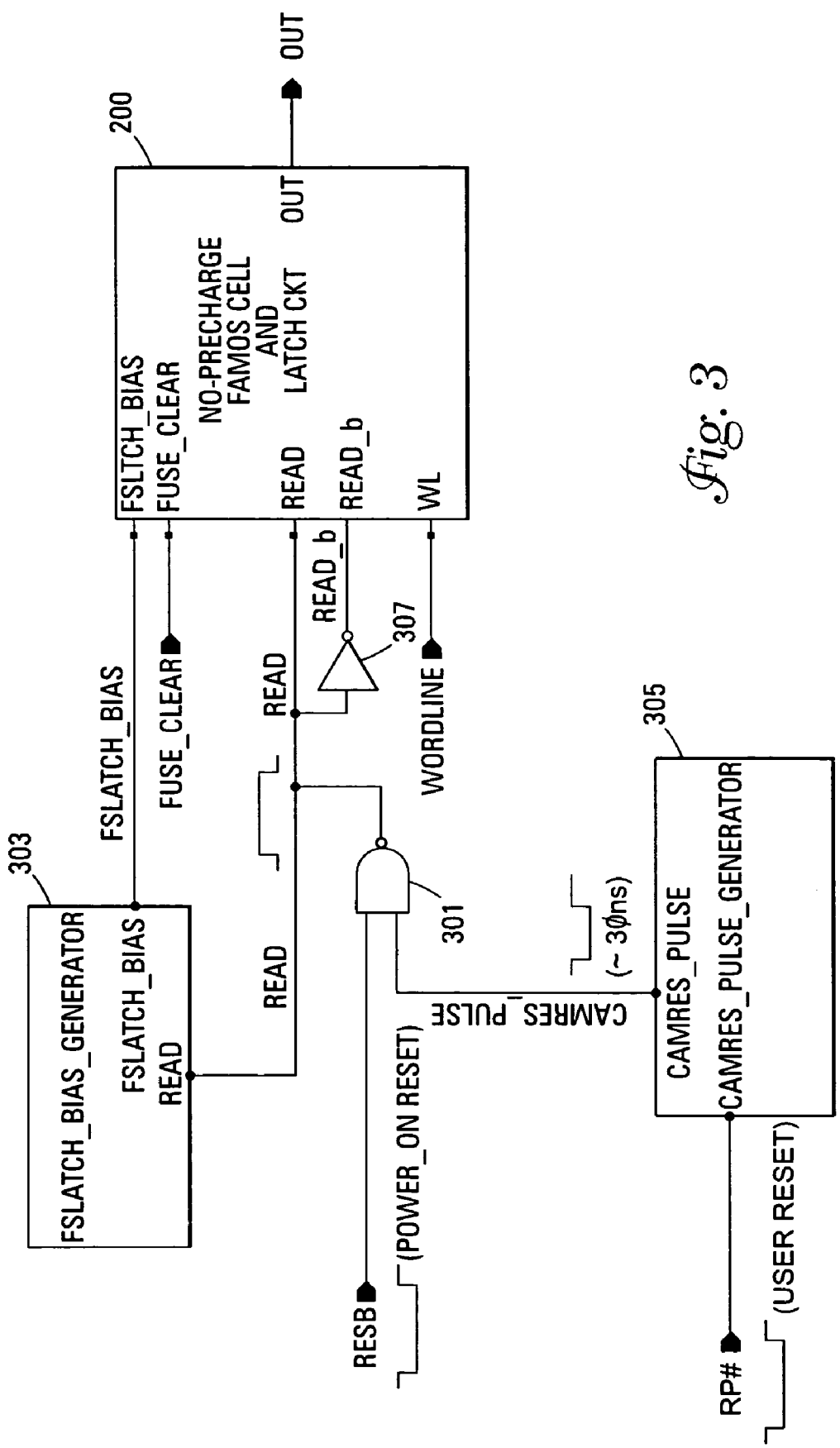
FIG. 3 shows a block diagram of one embodiment of a driver circuit of the present invention.

FIG. 3 illustrates one embodiment for a driver circuit of the present invention. This figure is for purposes of illustration only and does not limit the present invention to any one circuit for generating the signals required for proper operation of the no-precharge FAMOS cell and latch circuit.

A NAND gate 301 has one input tied to a power-on reset signal "RESb". The RESb signal is low when a power-on reset condition is experienced.

A CAMRES_PULSE_GENERATOR circuit 305 generates a signal indicating a user reset condition. This may occur due to a user initiating a reset as opposed to a power-on reset condition. The CAMRES_PULSE_GENERATOR circuit 305, in one embodiment, generates a low-going pulse that is low for a predetermined time. The generator 305 may be a one-shot circuit that generates a low pulse (CAMRES_PULSE), having a width of approximately 30 ns, on the falling edge of the user reset. However, alternate embodiments use other generators, states, and pulse widths to indicate the user reset condition.

The CAMRES_PULSE is input to the NAND gate 301. The NAND gate 301 then outputs a logical high pulse signal (READ) whenever either a power-on reset condition or a user reset condition is experienced. READ, therefore, is an active high reset indication signal. Alternate embodiments use other states and/or types of logic to indicate a power-on or user reset condition.

An inverter 307 has its input tied to READ signal and outputs the logical signal READ_b. READ_b always has the opposite logical value of the signal READ and is provided to the NO-PRECHARGE FAMOS CELL AND LATCH CKT circuit 200.

A FSLATCH_BIAS_GENERATOR 303 is connected to the output of the NAND gate 301. A high pulse READ signal causes the FSLATCH_BIAS_GENERATOR 303 to generate the FSLATCH_BIAS signal to the fuse latch circuit 200 of the present invention. The FSLATCH_BIAS signal is a voltage that, once applied to the FAMOS read circuit 203 of FIG. 2, reduces the current of a read circuit transistor to an appropriate value to allow the proper sensing of the FAMOS cell 201. In one embodiment, the FSLATCH_BIAS signal has an intermediate value between $V_{cc}$ and ground, that make the read circuit transistor driving the maximum current when at ground, while switching off that transistor when at $V_{cc}$. Methods for generating the FSLATCH_BIAS signal from the READ signal are well known in the art and are not discussed further.

The FUSE_CLEAR signal, in one embodiment, is coupled to a power-up reset signal or test reset signal. When coupled to a power-up reset signal, it must be avoided that FUSE_CLEAR and READ signals go at a logical high contemporarily, and, in addition, the FUSE_CLEAR signal must precede the READ one. This can be easily obtained with standard design techniques. When this signal goes high during a reset operation, the fuse latch is cleared to a default value. An alternate embodiment uses other logic levels or methods of generating this signal.

For purposes of clarity, the block diagram of FIG. 3 shows only one no-precharge FAMOS cell and latch circuit 200. However, a typical memory device may be comprised of thousands of these circuits.

Figure 4:
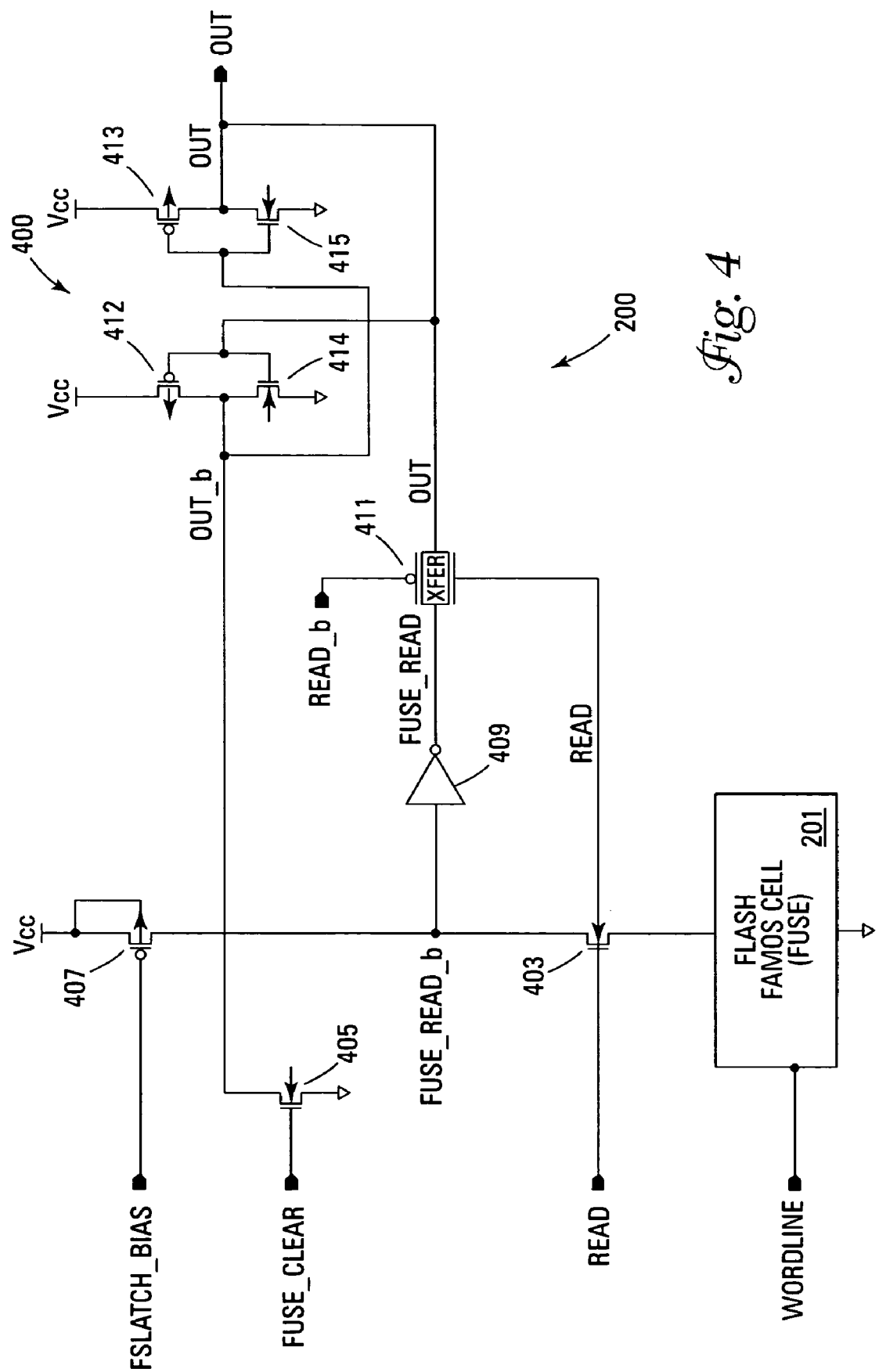
FIG. 4 shows a schematic diagram of one embodiment of the no-precharge FAMOS cell and latch circuit in accordance with the embodiment of FIG. 2.

FIG. 4 illustrates a schematic diagram of one implementation of the block diagram of the no-precharge FAMOS cell and latch circuit 200 of FIG. 2. The present invention is not limited to any one circuit architecture in generating the same or similar results as the fuse latch circuit 200 such that the latch retains the fuse contents even after a reset operation.

The circuit 200 includes the FAMOS cell 201 that includes the WORDLINE read input. The fuse 201 and its relevant operational characteristics were discussed previously.

The latch circuit 400 is comprised of four transistors 412–415. Two of the transistors are n-channel transistors 414 and 415. The other two transistors are p-channel transistors 412 and 413. Alternate embodiments may use a different architecture to form the latch circuit 400.

An n-channel transistor 405 is used as a reset circuit in conjunction with the FUSE_CLEAR signal. When this signal is a logical high, the transistor 405 is turned on and conducts such that OUT_b is a logical low and, therefore, OUT is a logical high. The latch circuit 400 is thus reset to a default logical high state.

In the embodiment illustrated in FIG. 4, a p-channel transistor 407 pulls up the FUSE_READ_b node. It is possible to make it easier to read the fuse cell 201 by reducing the transistor 407 drive strength, applying to its gate the proper FSLTCH_BIAS voltage. Similar results can be achieved in alternate embodiments by connecting the gate of the transistor 407 to $V_{ss}$ and enlarging the channel width of the cell. Still other embodiments can achieve substantially similar results with different methods and/or circuit components.

Assuming that the fuse 201 is erased (i.e., conducting), when WORDLINE is a logical high for a read operation and READ is a logical high, the transistor 403 coupled to the READ line is turned on. The FSLATCH_BIAS signal is normally at an intermediate voltage between $V_{cc}$ and $V_{ss}$, so that the p-channel transistor 407 maintains a current flowing through it lower than one that the fuse 201 is capable of supplying. FUSE_LATCH_b, therefore, is driven to a voltage below the inverter 409 threshold. The inverter 409 produces a logical high signal, FUSE_READ as an input to a transmission gate 411.

The signal READ being high and, thus, READ_b being low turns on the transmission gate 411. The logical high FUSE_READ signal is output to the latch circuit 400. Thus, OUT is kept at a logical high level.

Assuming that the fuse 201 is programmed (i.e., non-conducting), when an attempt is made to read the fuse 201 the p-channel transistor 407 pulls up the FUSE_READ_b node to a logical high state. FUSE_READ is therefore a logical low signal. When the transmission gate 411 is turned on by the READ and READ_b signals, the logical low signal is output to the latch circuit 400. OUT is now a logical low signal.

After the power-up, if the memory device is reset by the user (i.e., by RP# external signal), READ goes to a logical high state and turns on the n-channel transistor 403. Since the fuse 201 was programmed and does not drive current, the FUSE_READ_b node is still pulled up to a logical high state. Therefore, the OUT signal does not change after a reset operation. The value stored in the fuse latch circuit 200 is available for immediate use without waiting to be reloaded into the latch as required by the prior art.

Figure 5:
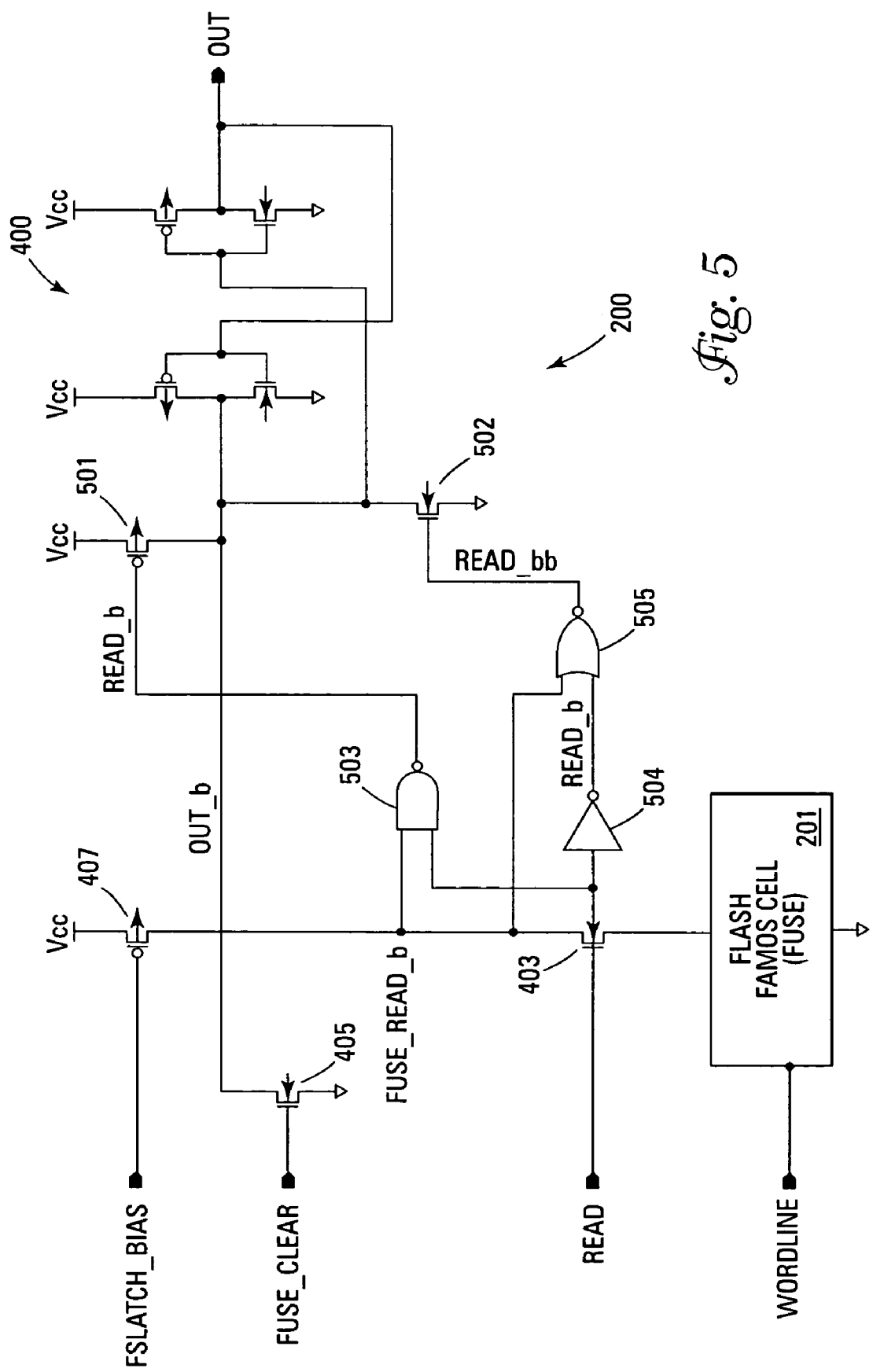
FIG. 5 shows a schematic diagram of an alternate embodiment of the no-precharge FAMOS cell and latch circuit in accordance with the embodiment of FIG. 2.

FIG. 5 illustrates an alternate circuit architecture of the block diagram of the fuse latch circuit 200 of FIG. 2. This embodiment accomplishes the same results as the embodiment of FIG. 4 but uses a greater number of transistors.

This embodiment is comprised of the same FAMOS cell (fuse) 201 and latch circuit 400 as used in FIG. 4. Additionally, the FUSE_CLEAR transistor 405, n-channel READ transistor 403, and p-channel current limiting transistor 407 are similarly used.

A p-channel transistor 501 is used to put the latch 400 into the "programmed" state while an n-channel transistor 502 puts the latch 400 into the "erased" state. These transistors 501 and 502 are controlled by a logic control circuit comprising logic gates 503–505 in order to put the latch 400 into the proper state.

In one embodiment, the logic control circuit includes a NAND gate 503 with one input coupled to the FUSE_READ_b node and the other input coupled to the READ signal. An inverter 504 has an input coupled to the READ signal and generates the READ_b signal. A NOR gate 505 has one input coupled to the FUSE_READ_b node and another input coupled to the READ_b signal. Alternate embodiments use other logic gate configurations to achieve substantially the same results.

If the fuse is erased, FUSE_READ_b is at a logical low level. Therefore, READ_b is a logic high and signal READ_bb is also high. In this case, the n-channel "erased" transistor 502 is turned on and the p-channel "programmed" transistor 501 is turned off. The latch 400 is loaded with a logic high state. The signal OUT, therefore, is now a high.

If the fuse is programmed, FUSE_READ_b is at a logic high level. Therefore, READ_b is a logic low and READ_bb is also a low. In this case, the p-channel "programmed" transistor 501 is turned on and the n-channel "erased" transistor is turned off. The latch is loaded with a logic low state. The signal OUT, therefore, is now a low.

Figure 6:
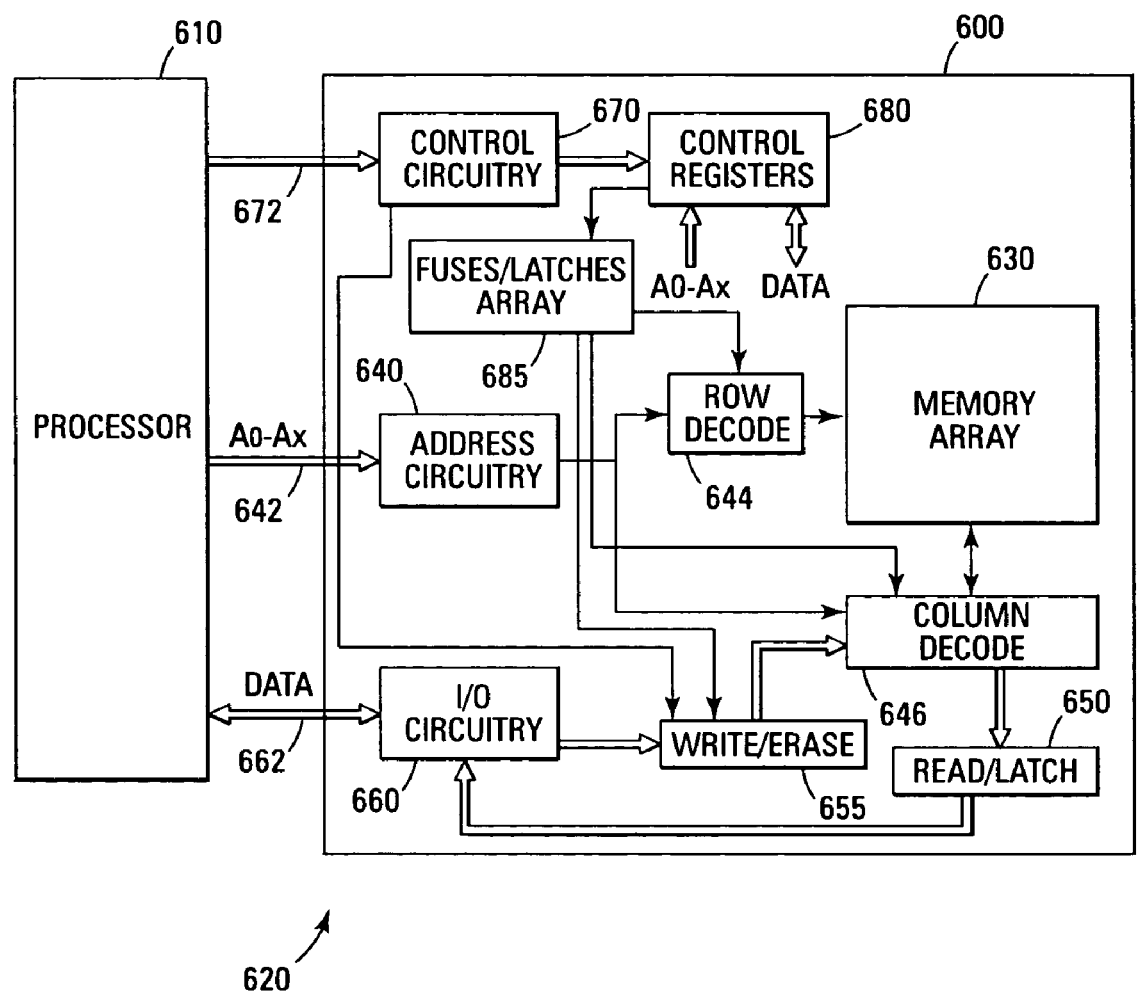
FIG. 6 shows a block diagram of one embodiment of a memory system that incorporates the no-precharge FAMOS cell and latch circuit of the present invention.

FIG. 6 illustrates a functional block diagram of a memory device 600 of one embodiment of the present invention that is coupled to a processor 610. The processor 610 may be a microprocessor, a processor, or some other type of controlling circuitry. The memory device 600 and the controller 610 form part of an electronic system 620. The memory device 600 has been simplified to focus on features of the memory that are helpful in understanding the present invention.

The memory device 600 includes an array of memory cells 630. The memory cells are non-volatile floating-gate memory cells and the memory array 630 is arranged in banks of rows and columns. In one embodiment, the memory array is a NAND-type architecture. In another embodiment, the memory array is a NOR-type architecture. The present invention is not limited to any one type of memory array architecture. The no-precharge FAMOS cell and latch circuit of the present invention may be located in the memory array 630 or any other location in the device 600.

An address buffer circuit 640 is provided to latch address signals provided on address input connections A0–Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense/latch circuitry 650. The sense/latch circuitry, in one embodiment, is coupled to read and latch a row of data from the memory array 630. Data input and output buffer circuitry 660 is included for bi-directional data communication over a plurality of data connections 662 with the controller 610). Write/erase circuitry 655 is provided to write data to the memory array.

Control circuitry 670 decodes signals provided on control connections 672 from the processor 610. These signals are used to control the operations on the memory array 630, including data read, data write, and erase operations. In one embodiment, the control circuitry 670 is a microcontroller that executes the embodiments of the automatic test entry termination methods of the present invention.

Chip select generation circuitry 625 generates the chip select signals for the memory device 600. This circuitry 625 uses the address connections 642 from the processor 610 to generate the appropriate chip select signal depending on the address present on the address connections 642.

The fuses/latches array 685 comprises the no-precharge FAMOS cell and latch circuit of the present invention. In this embodiment, the circuit interacts with the control registers 680, the write/erase circuit 655, the row decode 644, and the column decode 646.

The flash memory device illustrated in FIG. 6 has been simplified to facilitate a basic understanding of the features of the memory. A more detailed understanding of internal circuitry and functions of flash memories are known to those skilled in the art.

CONCLUSION

In summary, the no-precharge FAMOS cell and latch circuit of the present invention enables a memory device to be read immediately after a reset operation without waiting to precharge the latch with data from the cell. This is accomplished by providing a fuse and latch architecture that maintains the data after the reset operation.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A transistor circuit comprising:
    a storage transistor having either a programmed state or an erased state wherein the storage transistor does not conduct in the programmed state and conducts in the erased state;
    a latch, coupled to the storage transistor, for storing the state;
    a read circuit, coupled to the storage transistor and a reset indication signal, for sensing the state of the storage transistor; and
    a transfer circuit, coupled between the read circuit and the latch, for isolating the latch in response to a read operation caused by the reset indication signal such that the state stored in the latch remains after the reset indication signal indicates completion of the read operation.

2. The circuit of claim 1 and further including a clear circuit coupled to the latch for putting the latch into a predetermined state.

3. The circuit of claim 2 wherein the predetermined state is an erased state corresponding to a logical high.

4. The circuit of claim 1 and further including an inverter coupling the read circuit to the transfer circuit.

5. The circuit of claim 2 wherein the clear circuit is an n-channel transistor that is turned on by a clear signal.

6. The circuit of claim 1 wherein the read circuit comprises a p-channel transistor whose drive current, by applying a predetermined voltage to its gate, is reduced to allow a correct reading of the storage transistor.

7. The circuit of claim 1 wherein the storage transistor is a Floating gate Avalanche injection Metal Oxide Semiconductor transistor.

8. A flash memory device comprising:
    a memory array for storing data;
    control registers for accepting control signals; and
    no-precharge flash cell and latch circuit coupled to the control registers, the circuit comprising:

a flash cell having either a programmed state or an erased state;

a latch circuit, coupled to the fuse cell, for storing one of the states;

a flash cell read circuit coupled to the flash cell and a reset indication signal, the flash cell read circuit sensing the state of the flash cell; and a transmission gate, coupled between the flash cell read circuit and the latch circuit, for isolating the latch circuit when the reset indication signal is inactive and allowing the state of the flash cell through to the latch circuit when the reset indication signal is active.

9. The device of claim 8 wherein the latch circuit comprises a plurality of transistors organized to store a loaded state.

10. The device of claim 8 wherein the flash cell read circuit comprises a p-channel transistor as a pull up transistor whose drive current, by applying a predetermined voltage to its gate, is reduced to allow a correct reading of the flash cell, coupled to an n-channel transistor that is turned on by the reset indication signal.

11. The device of claim 8 wherein the transmission gate is further controlled by an inverse of the reset indication signal.

12. A flash memory device comprising:

a memory array for storing data;

control registers for accepting control signals for operation of the memory device; and a no-precharge flash cell and latch circuit, coupled to the control registers, the circuit comprising:

a flash cell having either a programmed state or an erased state that is read in response to an active wordline signal;

a latch circuit, coupled to the flash cell, for storing the state;

a flash cell read circuit coupled to the flash cell and comprising a p-channel pull-up transistor whose drive current, by applying a predetermined voltage to its gate, is reduced to allow a correct reading of the flash cell, coupled to an n-channel transistor that is turned on by a reset indication signal such that a node between the p-channel and n-channel transistors is pulled up to a logical high state when the wordline signal is active, the flash cell state is programmed, and the n-channel transistor is turned on;

an inverter coupled to the node for inverting the logical high state to a logical low state; and a transmission gate, coupled between the inverter and the latch circuit, for isolating the latch circuit when the reset indication signal is inactive and allowing the logical low state through to the latch circuit when the reset indication signal is active.

13. The device of claim 12 wherein the node is at a logical low state when the wordline is active, the flash cell state is erased, and the n-channel transistor is turned on such that the transmission gate allows a resulting logical high state from the inverter through to the latch circuit when the reset indication signal is active.

14. The device of claim 12 and further including a clearing transistor coupled to the latch circuit to reset the latch circuit to a known state.

* * * * *